United States Patent [19]
Tsuri et al.

[11] Patent Number: 6,049,035
[45] Date of Patent: Apr. 11, 2000

[54] PHOTOVOLTAIC DEVICE

[75] Inventors: Masao Tsuri, Mihara-gun; Masayuki Ohigashi, Sumoto; Masayoshi Maeba, Sumoto; Toshihiro Nomura, Sumoto; Yoshinobu Takabatake, Sumoto, all of Japan

[73] Assignee: Sanyo Electric Co., Ltd., Moriguchi, Japan

[21] Appl. No.: 09/153,070

[22] Filed: Sep. 15, 1998

[30] Foreign Application Priority Data

Sep. 18, 1997 [JP] Japan ................................. 9-253780

[51] Int. Cl.[7] ...................................................... H01L 25/00
[52] U.S. Cl. ............................................................ 136/246
[58] Field of Search ................................................ 136/246

[56] References Cited

FOREIGN PATENT DOCUMENTS

| 5-36284 | 9/1993 | Japan . |
| 8-5752 | 1/1996 | Japan . |
| 8-21162 | 8/1996 | Japan . |

*Primary Examiner*—Mark Chapman
*Attorney, Agent, or Firm*—Weneroth, Lind & Ponack, L.L.P.

[57] ABSTRACT

The photovoltaic device is provided with a photovoltaic element on the surface of a substrate, and a light diffuse transmission filter, which diffuses light passing through it, over the surface of the photovoltaic element. The light diffuse transmission filter is separated from the surface of the photovoltaic element via spacers or via a light transmitting gap layer.

21 Claims, 3 Drawing Sheets

PHOTOVOLTAIC DEVICE

This application is based on application No. 9-253780 filed in Japan on Sep. 18, 1997, the content of which is incorporated hereinto by reference.

BACKGROUND OF THE INVENTION

This invention relates to a photovoltaic device which converts light to electricity. In particular, this invention relates to a photovoltaic device which can have a front surface with an attractive appearance.

A wrist watch which uses a photovoltaic device as its power source has been developed. Since this type of watch is operated by electric power from a photovoltaic device, battery replacement is unnecessary.

For example, a prior art configuration is disclosed in Japanese Non-examined Patent Publication No.8-211162 which issued on Aug. 20, 1996. In this publication, a photovoltaic structure is disclosed comprising a photovoltaic device with a substrate having an insulating surface, a metal electrode layer, an amorphous silicon layer, and a transparent electrode layer, and a transparent electrode layer on top of the photovoltaic element. Further, the disclosed structure has a light diffuse transmission filter disposed on top of the transparent resin layer. Finally, the photovoltaic structure with the light diffuse transmission filter layered on top is assembled into a wrist watch housing.

Another prior art structure is disclosed in Japanese Non-examined Patent Publication No.8-5752 which issued on Jan. 12, 1996. In this patent application, the photovoltaic structure is cited only as an amorphous silicon layer formed on a substrate. Although details are not cited, it is believed to have the same photovoltaic structure as the previously mentioned disclosure, with a transparent resin layer on the light receiving surface. Further, a light diffuse transmission filter is disposed via spacers above the photovoltaic structure and the unit is assembled into a wrist watch housing.

A photovoltaic device which is disposed on an often viewed component such as the dial of a watch, greatly affects the design of that watch. A photovoltaic device fixed to a watch dial, does not always result in a watch dial having optimum coloration or appearance. The surface of a photovoltaic device is designed with the objective of efficiently absorbing light energy and producing as much electrical power as possible. The surface of a photovoltaic device is a dark color reflecting the color of the active photovoltaic semiconductor layer and interference coloration from the light receiving transparent electrode layer. A watch dial with an attractive appearance cannot always be designed with a dark colored photovoltaic device. Watch dials are typically colored with bright colors, such as white, rather than dark colors.

Further, a photovoltaic device is divided into a plurality of sections connected in series to increase the output voltage. The pattern of a photovoltaic device, divided into a plurality of sections, is perceptible at its surface. This type of pattern also does not necessarily provide a desirable decorative watch dial. For these reasons, a light diffuse transmission filter is disposed over the entire surface of the prior art photovoltaic structures.

However, in the prior art photovoltaic structures mentioned above, a layer of transparent resin is formed. A photovoltaic element with a transparent resin layer has an output characteristic which is only about 90% that of a photovoltaic element with no transparent resin layer. Further, when a light diffuse transmission filter is disposed over the entire surface of a photovoltaic structure having a transparent resin layer, the output characteristic drops to about 42% that of a photovoltaic element with no transparent resin layer after transparent electrode formation.

In this type of photovoltaic device, a light diffuse transmission filter is provided by applying transparent resin with particles mixed into the surface of the photovoltaic element. This light diffuse transmission filter can make a dark colored structure appear white. A photovoltaic device having transparent resin containing particles applied to the surface of the photovoltaic element is disclosed in Japanese Utility Model Publication No.5-36284 which issued on Sep. 14, 1993.

However, a photovoltaic device of this structure has the drawback of a detrimental effect on the photovoltaic element when transparent resin containing particles are applied. For example, if transparent resin containing particles are applied to the surface of the photovoltaic element by screen printing, the particles added to the transparent resin pierce into the amorphous silicon layer and short circuit the transparent electrode and metal electrode layers.

The present invention was developed to solve these types of problems.

Thus, it is a primary object of the present invention to provide a photovoltaic device which does not incur damage to the photovoltaic element, and has a surface which can be formed with an attractive color and design.

SUMMARY OF THE INVENTION

The photovoltaic device of the present invention is provided with a photovoltaic element on a substrate surface. A light diffuse transmission filter, which diffuses light passing through it, is disposed over the surface of the photovoltaic element. Further, the light diffuse transmission filter of the photovoltaic device of this invention is not disposed directly on the surface of the photovoltaic element, but rather is separated from the surface of the photovoltaic element by spacers.

In the photovoltaic device of this invention, surface color can be arbitrarily made into an attractive hue with the light diffuse transmission filter because the light diffuse transmission filter is separated from the surface of the photovoltaic element. Further, since a vacant region is established by the spacers, or a light transmitting gap layer interposed between the photovoltaic element and the light diffuse transmission filter, there is no damage to the photovoltaic element.

In addition, since the light diffuse transmission filter is separated from the photovoltaic element in the photovoltaic device of this invention, the light diffuse transmission filter can efficiently function to more effectively diffuse light which is transmitted through to the photovoltaic element. Therefore, this structure has the feature that the light diffuse transmission filter can make the pattern of the photovoltaic element more difficult to distinguish, as well as to effectively convert the dark color of the photovoltaic element surface to a bright color such as white. In particular, since this photovoltaic device does not have a transparent resin layer, its characteristics are improved over those of a prior art device having a transparent resin layer laminated on top of the photovoltaic element.

The photovoltaic device of this invention preferably has a light diffuse transmission filter attached to the substrate via spacers. The substrate, photovoltaic element, spacers, and light diffuse transmission filter are mutually joined in a laminate which takes the form of a single sheet or board.

In a photovoltaic device of this configuration, it is not necessary to separately assemble the photovoltaic substrate, the spacers, or the light diffuse transmission filter. Further, since the surface of the photovoltaic element is always protected, it cannot be damaged during transport of the photovoltaic device or when the device is assembled into an electronic part such as a watch.

Another preferred embodiment of the photovoltaic device of this invention has a light transmitting gap layer, which diffuses light passing through it, attached to the surface of the photovoltaic element. A light diffuse transmission filter is layered on, and attached to the surface of this light transmitting gap layer. The substrate, light transmitting gap layer, and light diffuse transmission filter of this photovoltaic device are mutually joined in a laminate to form of a single sheet or board. Since the light transmitting gap layer and light diffuse transmission filter can be formed in adhering layers by techniques such as methods, the manufacture of a photovoltaic device having this configuration is relatively simple.

Finally, particles can be added to transparent resin and a light diffuse transmission filter can also be formed on that surface by printing methods. Compared to a photovoltaic device having no light transmitting gap layer and a light diffuse transmission filter formed directly on the surface of the photovoltaic element, this device, with an intervening light transmitting gap layer, can prevent short circuits in the photovoltaic element caused by effects such as pressure during printing.

The above and further objects and features of the invention will be more fully apparent from the following detailed description in conjunction with the accompanying drawings.

DETAILED DESCRIPTION OF THE INVENTION

Figure 1:
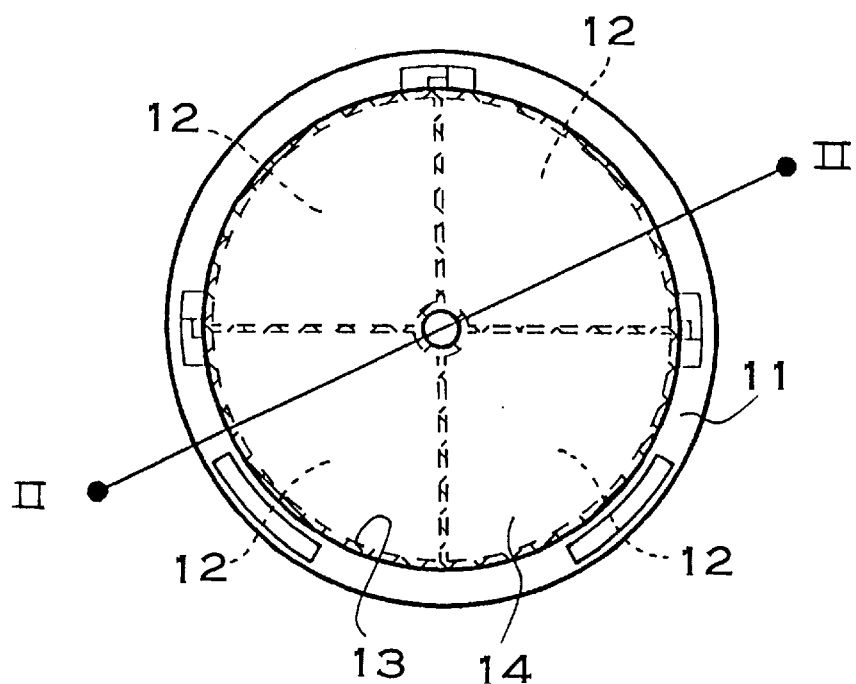
FIG. 1 is a plan view of an embodiment of the photovoltaic device constructed in accordance with this invention.
Figure 2:
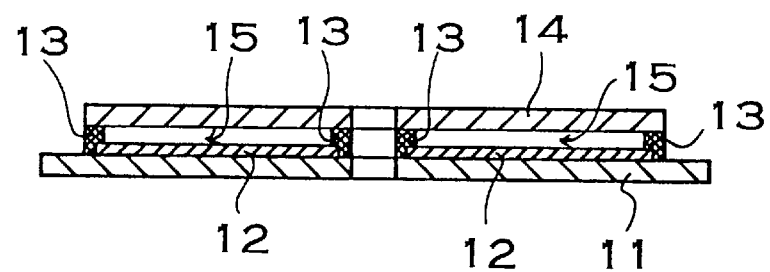
FIG. 2 is a cross-sectional view taken along line II—II of the photovoltaic device shown in FIG. 1.

Turning to the plan view of FIG. 1 and the cross-sectional view of FIG. 2, a photovoltaic device used on the dial of a watch is shown. In the photovoltaic device shown in these and other figures, a photovoltaic element 12, divided into four sections, is provided on the surface of a substrate 11, and a light diffuse transmission filter 14 is disposed over the surface of the photovoltaic element 12 surface via spacers 13. In FIG. 2, the regions indicated by cross-hatching are spacers 13 positioned below the light diffuse transmission filter 14.

The substrate 11 is thin sheet having an insulated layer on its surface. A photovoltaic device used for the dial of a watch utilizes a thin, flexible substrate 11. This substrate 11 is preferably a metal sheet with surfaces coated with polyimide resin. However, polyimide resin formed in a thin sheet may also be used as the substrate 11. In addition, a thin sheet made of other plastics may also be used.

As shown in the cross-section of FIG. 3, the photovoltaic element 12 is formed of consecutive layers of a metal electrode layer 12A on the surface of the substrate 11, an amorphous silicon (referred to below as a-Si) layer 12B, and a transparent electrode layer 12C. The film thickness of the metal electrode layer 12A is, for example, 0.1 $\mu$m to 1 $\mu$m, the film thickness of the a-Si layer 12B is, for example, 0.3 $\mu$m to 1 $\mu$m, and the film thickness of the transparent electrode layer 12C is, for example, 0.3 $\mu$m to 1 $\mu$m. The energy of light, which passes through the transparent electrode layer 12C and is incident on the a-Si layer 12B, is converted into electrical energy by the a-Si layer 12B of the photovoltaic element 12. Electrical energy is output at the metal electrode layer 12A and the transparent electrode layer 12C. High light transmittance and low electrical resistance characteristics are required for the transparent electrode layer 12C. ITO and $SnO_2$ films have previously been used to satisfy these thin film requirements. Since light transmission is not necessary for the metal electrode layer 12A, metal thin films such as aluminum are used.

As shown in FIG. 1, the photovoltaic element 12 is a laminate formed as a disk-shaped substrate 11 with its surface divided into four fan-shaped sections. The four sections of the photovoltaic element 12 are electrically inter-connected in series to boost the output voltage. The transparent electrode layer 12C and the metal electrode layer 12A of the four sections are connected in series at the periphery of the photovoltaic element 12.

The light diffuse transmission filter 14 of the photovoltaic element 12 is provided on the surface of the photovoltaic element 12 to optimize a design suitable to the application. The light diffuse transmission filter 14 has the highest light transmittance possible, and optimum color viewed from the surface and surface appearance depending on the application. A filter formed by mixing white particles into a transparent resin such as acrylic resin is used as the light diffuse transmission filter 14 of a photovoltaic device for a watch. Particles which are not white, such as red particles, may also be used in place of, or in addition to white particles. The thickness of the light diffuse transmission filter 14 is, for example, 0.1 mm to 1 mm, and preferably 0.2 mm to 0.5 mm.

The particles scatter light and make the surface of the photovoltaic element 12 behind the filter difficult to see. Particles of inorganic material with an average diameter of 1 $\mu$m to 10 $\mu$m, and preferably 3 $\mu$m to 7 $\mu$m are used. Particles of calcium carbonate, barium sulfate, silica, alumina, and titanium oxide, etc. are used as white particles. Red iron oxide can be used, for example, as red particles.

The particles are introduced into a binder such as transparent resin and formed in the shape of a thin sheet. For example, acrylic resin is used as the transparent resin to bind the particles and form a sheet. The quantity of particles added to the transparent resin binder is 10% to 70% by weight. As the quantity of particles added is increased, the surface of the photovoltaic element 12 can be made more difficult to see, but light transmittance is reduced. Consequently, the optimum quantity of particles to be added is determined considering surface conditions of the light diffuse transmission filter 14, light transmittance, and thickness of the light diffuse transmission filter 14.

In addition, a ceramic filter, as described below, can be used as another type of light diffuse transmission filter. Particles of ceramic material such as alumina, titanium oxide, and zirconium oxide, etc. are used in this type of filter. To sinter the particles into a thin sheet, polyvinyl alcohol (PVA) can be used as a binder to form the particles into a film. The binder and particles are mixed together, formed into film, and after drying, baked to sinter the material. During the baking process, the added binder is baked out of the material.

The light diffuse transmission filter 14 is not closely adhered to the surface of the photovoltaic element 12, but rather is separated via spacers 13. The spacers 13 are provided to separate the light diffuse transmission filter 14 a fixed distance away from the surface of the photovoltaic element 12. The thickness of the spacers 13 determines the width of the light transmitting gap 15 provided between the light diffuse transmission filter 14 and the photovoltaic element 12. As the spacers 13 are made thicker, the light transmitting gap 15 becomes wider. The wider the light transmitting gap 15, the greater the effect of light diffusion by the light diffuse transmission filter 14. This is the same as viewing an object placed behind a piece of frosted glass, where the object rapidly becomes difficult to recognize as it is moved away from the frosted glass. The frosted glass scatters light passing through it, and has the property that an object in close contact with the back of the frosted glass is easier to see than an object separated from it.

When the spacers 13 are made thicker and the light transmitting gap 15 made wider, the pattern of the photovoltaic element 12 can be made difficult to discern by the light diffuse transmission filter 14. In addition, the light diffuse transmission filter 14 can effectively convert the dark color of the photovoltaic element 12 to a bright color such as white. The thickness of a spacer 13 is, for example, 5 $\mu$m to 100 $\mu$m, and preferably 5 $\mu$m to 30 $\mu$m. If the spacers 13 are too thick, the overall thickness of the photovoltaic device becomes excessive. If the spacers 13 are too thin, the light diffuse transmission filter 14 is too close to the surface of the photovoltaic element 12 and the effect of the filter is reduced. Consequently, an optimum spacer 13 thickness is determined considering the overall thickness of the photovoltaic device and the effectiveness of the light diffuse transmission filter 14.

The spacers 13 of the photovoltaic device shown in FIGS. 1 and 2 are provided at the periphery of the photovoltaic element 12 which is not an effective electric energy producing region, and on the borders between the four sections of the photovoltaic element 12. The spacers 13 are provided by applying a transparent resin which is an epoxy resin system, acrylic resin system, or urethane resin system to the surface of the substrate 11 on which the photovoltaic element 12 is laminated. Transparent resin spacers 13 have the feature that conditions can be arranged so they do not stand out when viewed from the surface of the light diffuse transmission filter 14. As described above, the spacers 13 are positioned at regions which do not contribute to the production of electrical energy, and therefore, there is no output characteristic degradation due to the provision of spacers 13. In addition, the spacers 13 can mechanically stabilize and retain the light diffuse transmission filter 14. However, it is not always necessary to use a transparent resin for the spacers, and resins with coloration may also be used. Spacers using colored resin can accentuate the colored appearance of the light diffuse transmission filter.

Details of an example of spacers 13 using transparent resin follows. The transparent resin is printed at specified locations on the substrate 11 by a method such as screen printing. Further, as shown in the cross-section of FIG. 3, the spacers 13 preferably are disposed at the periphery of the photovoltaic element 12 and extend over the element surface. The spacers 13 are also disposed at the gaps between photovoltaic element sections in a manner that bridges over the gap between adjacent sections. This configuration of spacers 13 covers the boundaries of the photovoltaic element 12 sections. Although the spacers 13 are transparent resin, reflected light is somewhat reduced by the spacers and this configuration has the feature that photovoltaic element boundaries do not visually stand out. Furthermore, the spacers 13 also have the effect of protecting the periphery of the photovoltaic element 12.

In the photovoltaic device shown in FIGS. 1 and 2, a photovoltaic element 12 is formed as a laminate, spacers are layered on that surface at specified locations, and finally a light diffuse transmission filter 14, which is a separately formed film or sheet, is attached to complete fabrication.

Figure 4:
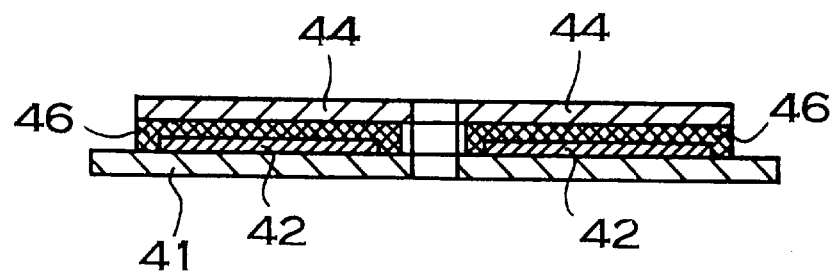
FIG. 4 is a cross-sectional view of another embodiment of the photovoltaic device constructed in accordance with this invention.
Figure 5:
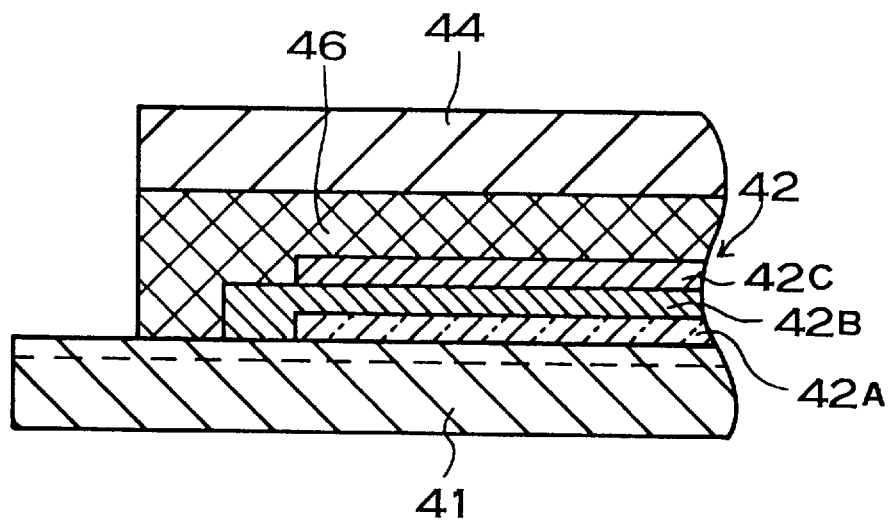
FIG. 5 is an enlarged cross-sectional view of important elements of another embodiment of a photovoltaic device constructed in accordance with the invention.

Turning to the cross-sections of FIGS. 4 and 5, the photovoltaic device of this invention may also be fabricated by forming a laminate photovoltaic element 42 on the surface of a substrate 41, and further layering a light diffuse transmission filter 44 via a light transmitting gap layer 46 which covers the entire surface of the photovoltaic element 42. In this photovoltaic device configuration, the light transmitting gap layer 46 is tightly adhered to the surface of the photovoltaic element 42, and the light diffuse transmission filter 44 is in turn tightly adhered to the surface of the light transmitting gap layer 46 to form a laminate. In this photovoltaic device configuration, the structure of the substrate and photovoltaic element is identical to that shown in FIGS. 1 and 2.

The light transmitting gap layer 46 is formed as a film of transparent resin by a printing method such as screen printing or by an application method such as spraying. The light transmitting gap layer 46 is closely adhered to the surface of the photovoltaic element 42 and is laminated on that surface with no intervening air gap. The light transmitting gap layer 46 is formed in the photovoltaic device fabrication process after establishing the photovoltaic element 42 laminate on the substrate 41. The light transmitting gap layer 46 is formed as a film by printing or applying transparent resin at the specified location. The light transmitting gap layer 46 is formed in a manner that covers the entire surface of the photovoltaic element 42. The same plastics described for use as spacers can be used to form the light transmitting gap layer 42 film.

The light transmitting gap layer 46 is established for the same purpose as the spacers to separate the light diffuse transmission filter 44 from the photovoltaic element 42 surface. Therefore, the film thickness of the light transmitting gap layer 46 is the same as the spacers, for example, 5 $\mu$m to 100 $\mu$m, and preferably 5 $\mu$m to 30 $\mu$m.

Figure 3:
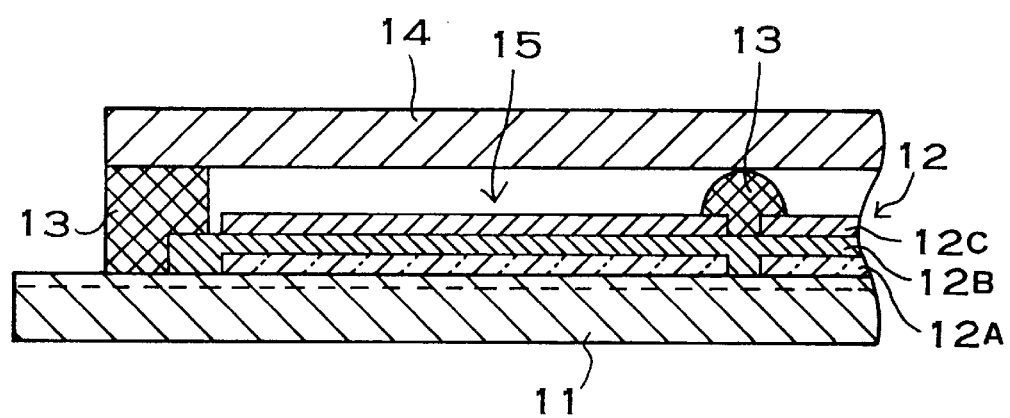
FIG. 3 is an enlarged cross-sectional view of important elements of the photovoltaic device shown in FIG. 2.

Unlike the photovoltaic device structure shown in FIGS. 1 through 3, the light diffuse transmission filter of the structure shown in FIG. 4 is not fabricated as a separate part. After formation of the light transmitting gap layer 46, the light diffuse transmission filter 44 is laminated to closely adhere to that surface, without forming an air gap, by screen printing or another application method. The light diffuse transmission filter 44 is made of particles mixed into a transparent resin binder in the same manner as the light diffuse transmission filter 14 of the photovoltaic device shown in FIGS. 1 through 3. The particles and binder described previously for use in the photovoltaic device shown in FIGS. 1 through 3 can be used for the light diffuse transmission filter of this configuration.

First Preferred Embodiment

The photovoltaic device structure shown in FIGS. 1 and 2 is fabricated by the following process steps. Here, the photovoltaic element 12 has an outside diameter of approximately 23 mm and is divided into four fan-shaped sections.

(1) First, the light diffuse transmission filter 14 is fabricated for attachment to the photovoltaic element 12 surface. The light diffuse transmission filter 14 is made by mixing alumina particles with an average diameter of about 5 μm in polyvinyl alcohol, and sintering to form a sheet or film. The polyvinyl alcohol is used as a binder to form the alumina into a film and is lost during sintering. A light diffuse transmission filter 14 with a thickness of about 0.4 mm is formed by this process.

(2) A metal electrode layer 12A, an a-Si layer 12B, and a transparent electrode layer 12C are laminated on the surface of a polyimide resin substrate 11 to provide a photovoltaic element 12 which is divided into four fan-shaped sections.

(3) Spacers 13 made of transparent resin are established on the substrate surface 11 at the periphery of the photovoltaic element 12 and at the boundaries between the four sections of the photovoltaic element 12. The spacers 13 are made of transparent resin by screen printing and with a film thickness of 10 μm that forms the light transmitting gap 15. Acrylic resin is used as the transparent resin. As shown in FIG. 3, the spacers 13 are provided at the periphery of the photovoltaic element 12 in a manner that covers the surface of the photovoltaic element 12.

(4) Before the transparent resin which forms the spacers 13 hardens, the light diffuse transmission filter 14 is attached to the spacers 13 to fix the light diffuse transmission filter 14 over the surface of the photovoltaic element 12. The light diffuse transmission filter 14 is fixed in a position separated 10 μm from the surface of the photovoltaic element 12 by the spacers 13.

Second Preferred Embodiment

The photovoltaic device structure shown in FIG. 4 is fabricated by the following process steps. Here, the photovoltaic element 42 has an outside diameter of approximately 23 mm and is divided into four fan-shaped sections.

(1) A metal electrode layer 42A, an a-Si layer 42B, and a transparent electrode layer 42C are laminated on the surface of a polyimide resin substrate 41 to provide a photovoltaic element 42 divided into four fan-shaped sections.

(2) Transparent resin is applied to the entire surface of the photovoltaic element 42 to provide a light transmitting gap layer 46. The transparent resin is screen printed to establish a light transmitting gap layer 46 having a thickness of 10 μm. An acrylic system resin is used as the transparent resin.

(3) After hardening of the transparent resin which forms the light transmitting gap layer 46, transparent resin mixed with particles is screen printed on the entire surface of the light transmitting gap layer 46 to establish a 13 μm thick light diffuse transmission filter 44. An epoxy system resin is used as the transparent resin, and alumina (particle diameter about 3 μm to 7 μm) is used as the particles for the light diffuse transmission filter 44. The quantity of alumina added is 10% by weight.

Subsequent investigation of yield characteristics demonstrated that the present embodiment had a yield of 100%. As a comparative example, devices, which had the light diffuse transmission filter formed directly on the surface of the photovoltaic element with no light transmitting gap layer, showed a yield of 50%. This was a result of pressure applied during screen printing, which caused particles to pierce through the a-Si layer and short circuit the metal and transparent electrode layers, in the comparative example. Conversely, for the present embodiment, a 10 μm thick light transmitting gap layer 46 kept particles from piercing the a-Si layer. Consequently, no short circuits were generated.

As shown in Table 1 below, the photovoltaic devices fabricated for the first and second preferred embodiments described above showed excellent characteristics. Measurements for Table 1 were made with a fluorescent light of 200LX luminosity. In Table 1, the ratio in percent for the device after light diffuse transmission filter formation with respect to the device after transparent electrode layer formation is shown in parentheses.

In Table 1, the same light diffuse transmission filter used in the first preferred embodiment was used for the comparative prior art example. Namely, the prior art example was a photovoltaic structure made with transparent resin laminated on the photovoltaic element as described in Japanese Non-examined Patent Publication No.8-211162 issued on Aug. 20, 1996 and using the same filter used in the first preferred embodiment.

TABLE 1

|  | After Transparent Electrode Formation | After Light Diffuse Transmission Filter Layer |  |
| --- | --- | --- | --- |
| First Preferred Embodiment |  |  |  |
| Open Circuit Voltage | 2.401 V | 2.263 V | (94.3) |
| Short Circuit Current | 15.82 μA | 7.546 μA | (47.7) |
| Operating Current (1.5 V) | 14.007 μA | 6.477 μA | (46.2) |
| Linearity | 62.6% | 60.6% | (96.8) |
| Second Preferred Embodiment |  |  |  |
| Open Circuit Voltage | 2.401 V | 2.255 V | (93.9) |
| Short Circuit Current | 15.82 μA | 7.402 μA | (46.8) |
| Operating Current (1.5 V) | 14.007 μA | 6.283 μA | (44.9) |
| Linearity | 62.6% | 59.8% | (95.5) |
| Prior Art Example |  |  |  |
| Open Circuit Voltage | 2.401 V | 2.237 V | (93.2) |
| Short Circuit Current | 15.82 μA | 7.083 μA | (44.8) |
| Operating Current (1.5 V) | 14.007 μA | 5.853 μA | (41.8) |
| Linearity | 62.6% | 57.9% | (92.5) |

As this invention may be embodied in several forms without departing from the spirit or essential characteristics thereof, the present embodiment is therefore illustrative and not restrictive, since the scope of the invention is defined by the appended claims rather than by the description preceding them, and all, changes that fall within the metes and bounds of the claims or equivalence of such metes and bounds thereof are therefore intended to be embraced by the claims.

What is claimed is:

1. A photovoltaic device comprising:
(a) a substrate;
(b) a photovoltaic element, without a transparent resin layer, provided on a surface of said substrate;
(c) a light diffuse transmission filter for diffusing light passing therethrough, said light diffuse transmission filter being disposed over a surface of said photovoltaic element; and (d) a plurality of spacers disposed between said photovoltaic element and said light diffuse transmission filter such that the surface of said photovoltaic element is separated from an opposing surface of said light diffuse transmission filter.

2. A photovoltaic device as claimed in claim 1, wherein the light diffuse transmission filter is attached to the substrate via said spacers, and said substrate, said photovoltaic element, said spacers, and said light diffuse transmission filter are laminated and attached so as to make a single piece in the form of a sheet or board.

3. A photovoltaic device as claimed in claim 1, wherein said spacer has a spacer thickness of 5 $\mu$m to 100 $\mu$m.

4. A photovoltaic device as claimed in claim 3, wherein said spacer has a spacer thickness of 5 $\mu$m to 30 $\mu$m.

5. A photovoltaic device as claimed in claim 1, wherein:

said photovoltaic element is divided into a plurality of sections and is provided on the surface of said substrate; and said spacers are disposed along borders between said photovoltaic element sections in regions where no contribution is made to the production of electrical energy.

6. A photovoltaic device as claimed in claim 1, wherein:

said photovoltaic element is divided into a plurality of sections and is provided on the surface of said substrate; and said spacers are disposed in regions where little or no contribution is made to the production of electrical energy, and said spacers span a gap between adjacent photovoltaic element sections.

7. A photovoltaic device as claimed in claim 1, wherein said spacers are disposed along the periphery of said photovoltaic element where little or no contribution is made to the production of electrical energy.

8. A photovoltaic device as claimed in claim 1, wherein said spacers are formed of transparent resin which is applied to the surface of said photovoltaic element.

9. A photovoltaic device as claimed in claim 1, wherein said spacers comprise colored resin that is applied to the surface of said photovoltaic element.

10. A photovoltaic device as claimed in claim 1, wherein said light diffuse transmission filter comprise particles mixed into transparent resin in the form of a sheet or board.

11. A photovoltaic device as claimed in claim 10, wherein the transparent resin is acrylic resin.

12. A photovoltaic device as claimed in claim 10, wherein the particles are white in color.

13. A photovoltaic device as claimed in claim 10, wherein the particles have an average diameter of 1 $\mu$m to 10 $\mu$m.

14. A photovoltaic device as claimed in claim 10, wherein the particles are either calcium carbonate, barium sulfate, silica, alumina, or titanium oxide.

15. A photovoltaic device as claimed in claim 1, wherein said light diffuse transmission filter is a ceramic filter formed of particles of ceramic material sintered in the form of a sheet or board.

16. A photovoltaic device comprising:

(a) a substrate;

(b) a photovoltaic element provided on a surface of said substrate;

(c) a light transmitting gap layer laminated and attached to a surface of said photovoltaic element; and (d) a light diffuse transmission filter laminated and attached to a surface of said light transmitting gap layer, wherein said substrate, said light transmitting gap layer, and said light diffuse transmission filter are joined in a laminate to constitute a single piece in the form of a sheet or board.

17. A photovoltaic device as claimed in claim 16, wherein said light diffuse transmission filter comprises particles that are mixed into a transparent resin material, and said light diffuse transmission filter is formed by a printing method.

18. A photovoltaic device as claimed in claim 16, wherein said light transmitting gap layer has a film thickness of 5 $\mu$m to 100 $\mu$m.

19. A photovoltaic device as claimed in claim 18, wherein said light transmitting gap layer has a film thickness of 5 $\mu$m to 30 $\mu$m.

20. A photovoltaic device as claimed in claim 16, wherein said light transmitting gap layer is provided on the surface of said photovoltaic element by screen printing.

21. A photovoltaic device as claimed in claim 16, wherein said light diffuse transmission filter is provided on the surface of the light transmitting gap layer by screen printing.

* * * * *